United States Patent [19]

Komori et al.

[11] Patent Number: 4,697,198

[45] Date of Patent: Sep. 29, 1987

[54] MOSFET WHICH REDUCES THE SHORT-CHANNEL EFFECT

[75] Inventors: Kazuhiro Komori, Kodaira; Kenichi Kuroda, Tachikawa; Kousuke Okuyama, Kodaira, all of Japan

[73] Assignee: Hitachi, Ltd., Tokyo, Japan

[21] Appl. No.: 763,612

[22] Filed: Aug. 8, 1985

[30] Foreign Application Priority Data

Aug. 22, 1984 [JP] Japan .................................. 59-173239
Jun. 21, 1985 [JP] Japan .................................. 60-134040

[51] Int. Cl.⁴ ............................................. H01L 29/78
[52] U.S. Cl. ............................ 357/23.3; 357/23.11; 357/23.9; 357/23.8; 357/23.12
[58] Field of Search ................. 357/23.3, 23.8, 23.12, 357/23.9, 23.11

[56] References Cited

U.S. PATENT DOCUMENTS

| | | | |
|---|---|---|---|
| 3,936,857 | 2/1976 | Ota | 357/23.3 |
| 4,143,388 | 3/1979 | Esaki et al. | 357/23.3 |
| 4,212,683 | 7/1980 | Jones et al. | 357/23.12 X |
| 4,219,829 | 8/1980 | Dorba et al. | 357/23.12 |
| 4,247,860 | 1/1981 | Tihanyi | 357/23.12 |
| 4,267,558 | 5/1981 | Guterman | 357/23.8 |

FOREIGN PATENT DOCUMENTS

| | | | |
|---|---|---|---|
| 0073623 | 3/1983 | European Pat. Off. | 357/23.3 |
| 55-50396 | 12/1980 | Japan | 357/23.12 |
| 0574166 | 1/1982 | Japan | 357/23.8 |

OTHER PUBLICATIONS

Abbas et al., "Short Channel Field-Effect Transistor," *IBM Technical Disclosure Bulletin*, vol. 17, No. 11, Apr. 1975, p. 3263.

*Primary Examiner*—Andrew J. James
*Assistant Examiner*—William A. Mintel
*Attorney, Agent, or Firm*—Antonelli, Terry & Wands

[57] ABSTRACT

Disclosed herein is a MOS-type field-effect transistor in which a semiconductor region having the same type of conductivity as the substrate and an impurity concentration higher than that of the substrate is formed under the channel so as to come at both ends thereof into contact with the source and drain regions. The semiconductor region restricts the extension of depletion layer from the source and drain regions, and restricts the short-channel effect. The junction capacity is small between the semiconductor region and the source and drain regions.

18 Claims, 20 Drawing Figures

MOSFET WHICH REDUCES THE SHORT-CHANNEL EFFECT

BACKGROUND OF THE INVENTION

The present invention relates to a semiconductor device having MOS-type field-effect transistors, and particularly to a semiconductor device which enables elements to be formed in small sizes and with a high degree of integration to be realized, and to a process for manufacturing the same The trend toward producing semiconductor devices in highly integrated form in recent years has required scaling-down MOS (metal oxide semiconductor)-type field-effect transistors (MOSFET's). However, scaling-down has resulted in the development of a so-called short-channel effect, imposing problems such as reduced threshold voltage Vth and the like. Therefore, it has been attempted to extinguish the short-channel effect by providing the channel region of MOS-type field-effect transistors with a semiconductor region having the same conductivity type as that of the substrate.

For instance, IEEE Transactions on Electronic Devices (Vol. ED-29, No. 4, 1982, pp. 607–610) discloses a device that is illustrated in FIG. 8. That is, in an MOS-type field-effect transistor 1, a p-type impurity layer 4 of a high concentration is formed on the lower side of not only a gate electrode but also n+-type source and drain regions 3. Under the gate electrode, furthermore, a region 2 implanted with phosphorus ions is formed, thereby to form a buried channel which increases the threshold voltage Vth to reduce the short-channel effect.

According to this construction, however, it has been found by the inventors of the present invention that since the contact area increases between the p-type region 4 and the n+-type source and drain regions 3, the junction capacity increases between them to make it difficult to operate the elements at high speeds.

The above-mentioned literature further proposes a device in which a p-type region is formed under the channel only. Even with this construction, however, the p-type region and the source and drain regions are contacted with each other in relatively wide areas, making it difficult to fulfill the object of high-speed operation.

SUMMARY OF THE INVENTION

An object of the present invention is to provide a semiconductor device having MOS-type field-effect transistors that can be formed in small sizes.

Another object of the present invention is to provide a semiconductor device having MOS-type field-effect transistors, which enables elements to be formed in small sizes to decrease the short-channel effect and to reduce the junction capacity relative to the source and drain regions, so that the elements can be operated at high speeds.

A further object of the present invention is to provide a process for manufacturing semiconductor devices, according to which a semiconductor region having the same conductivity type as the substrate and having a higher impurity concentration than the substrate, is formed at least under the channel of the MOS-type field-effect transistor, and the contacting area between the semiconductor region and the source and drain regions is made as small as possible.

The above and other objects as well as novel features of the present invention will become obvious from the description of the specification and the accompanying drawings.

A representative example of the invention disclosed in the specification will be described below briefly.

A semiconductor region (i.e., having the same type of conductivity as the substrate and a higher impurity concentration than the substrate) having the conductivity type opposite to that of the source and drain regions is formed at least under the channel of the MOS-type field-effect transistor. The semiconductor region is so formed that one end will come into contact with the source region and the other end with the drain region. This enables the short-channel effect to be reduced in spite of scaling-down of the elements, and the junction capacity to be reduced between the semiconductor region and the source and drain regions, so that elements can be operated at high speeds.

Further, using the gate electrode, which is formed after impurity ions are deeply implanted into the semiconductor substrate, as a mask, impurities are introduced to compensate the above ion-implanted layer thereby to form the aforementioned semiconductor region. Using the gate electrode as a mask, furthermore, impurities are introduced to form the source and drain regions. Thus, there is obtained a MOS-type fieldeffect transistor having the semiconductor region that is contacted to the source and drain regions in a small area.

DESCRIPTION OF THE PREFERRED EMBODIMENTS

FIGS. 1(A) to 1(D) show the steps for manufacturing an n-channel MOS-type field-effect transistor according to an embodiment of the present invention.

Figure 1A:
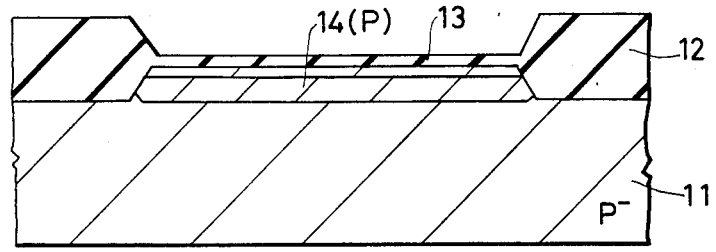
FIGS. 1(A) to 1(D) are sectional views showing steps in a manufacturing process according to an embodiment of the present invention, and showing the finished state.

First, as shown in FIG. 1(A), a field insulating film (SiO$_2$ film) 12 and a gate insulating film (SiO$_2$ film) 13 are formed by a well-known technique on the main surface of a semiconductor substrate 11 which is made of a p$^-$-type single crystalline silicon. Then, using the field insulating film 12 as a mask, boron ions are implanted at a concentration of $2 \times 10^{12}/cm^2$ and are activated by annealing. The ions are implanted with high energy such as 100 KeV. Therefore, a p-type semiconductor regions 14 of a high impurity concentration is formed like a belt at a relatively deep position in the substrate 11. The p-type region 14 will have the highest impurity concentration at a position which is about 0.2 μm below the surface of the substrate.

Figure 1B:
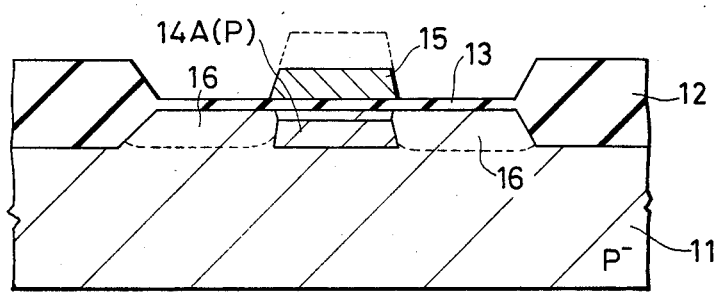

Referring to FIG. 1(B), there is formed a gate electrode 15 comprised of a polycrystalline silicon film (about 2000 angstroms thick) and a tungsten silicide film (about 2000 angstroms thick) formed thereon. For the purpose of convenience, FIG. 1 shows the gate electrode 15 to be composed of a single film. Using the gate electrode 15 as a mask, n-type impurities such as phosphorus ions having a conductivity type opposite to that of the above-mentioned impurities, are implanted into the substrate 11 at 100 KeV and $1 \times 10^{-13}/cm^2$, and are annealed, Here, the ions are implanted in a dosage that compensates the above-mentioned p-type region 14. Thus, the implanted phosphorus ions will have a peak concentration at a position about 0.2 μm below the surface of the substrate. Therefore, the ion implanted portions 16 have a p-type impurity concentration which is substantially equal to that of the substrate 11. A semiconductor region 14A is left only under the gate electrode 15 at a position remote from the main surface of the substrate 11.

In this embodiment, the ion-implanted portions 16 may have an impurity concentration higher than that of the substrate 11. However, the impurity concentration of portions 16 should not be higher than that of the p-type region 14. The same also holds true in the subsequent embodiments. The invention includes the embodiment where portions corresponding to the ion-implanted portions 16 have an impurity concentration higher than that of the substrate 11 but lower than that of the regions corresponding to the p-type region 14.

The ions may be implanted under the condition where a masking member (photoresist film, silicon oxide film, or the like) for forming the gate electrode 15 is left on the gate electrode 15. Any masking member having a large thickness that exists on the gate electrode 15, as indicated by a dotted line in FIG. 1(B), can be used as a mask for implanting ions with high energy, irrespective of the thickness of the gate electrode 15. When used as a mask, the photoresist film should have a thickness of about 1 μm and the silicon oxide film should have a thickness of about 5000 angstroms. Further, when the gate electrode 15 consists of a polycrystalline silicon doped with phosphorus, its thickness should be greater than 4000 angstroms. When the masking member or the gate electrode 15 has a thickness greater than the above-mentioned values, the ions can be implanted with greater energy (for example, at 200 KeV) in the steps of FIGS. 1(A) and 1(B). By using these energies, the impurities implanted are distributed deeply in the substrate.

Figure 1C:
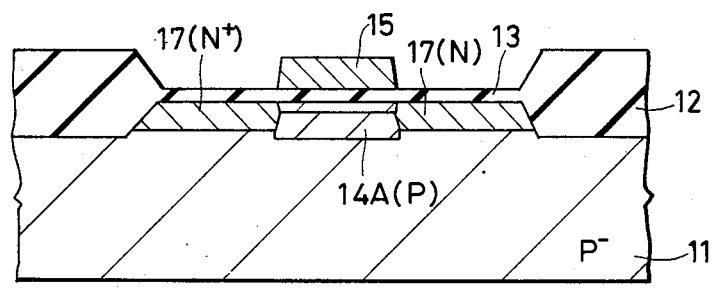

Then, like the above steps, arsenic ions are implanted into the substrate 11 using the gate electrode 15 as a mask. Thus, there is formed a shallow n+-type region 17 having a high impurity concentration (the ions are implanted with the energy of as small as several tens of KeV), i.e., there are formed source and drain regions as shown in FIG. 1(C). The impurity concentration in the surface of the regions 17 may be, for example, $1 \times 10^{20}$ atoms/cm³ and the junction depth may be, for example, 0.2 μm (a depth where the p-type region 14A has the greatest impurity concentration). Therefore, the completed source and drain regions 17 come into contact with a part of the p-type region 14A, i.e., come into contact with a portion of the greatest concentration under each side of the gate electrode 15. Namely, the region 14A does not come into contact with the bottom of source and drain regions 17.

Figure 1D:
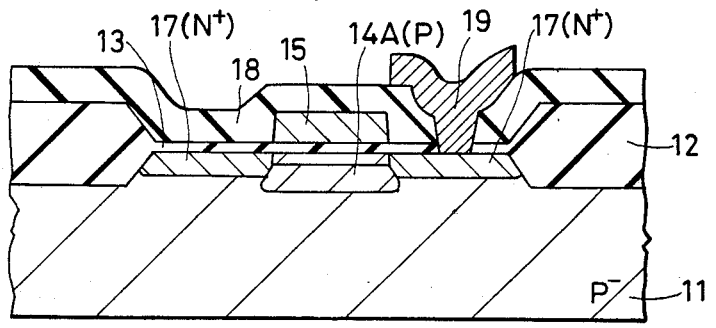

Then, as shown in FIG. 1(D), an interlayer film 18 made of PSG (phosphosilicate glass) and a wiring layer 19 made of aluminum are formed to complete an MOS-type field-effect transistor. Here, the wiring 19 is connected to one semiconductor region 17 only. It is evident that the wiring 19 may be connected to the other semiconductor region, as a matter of course.

In the thus constructed MOS-type field-effect transistor, a portion having the greatest impurity concentration does not exist on the main surface of the substrate 11 but exists in the interior thereof (being remote from the main surface). Further, the stretching of the depletion layer from the source and drain regions 17 is suppressed by the p-type region 14A. In particular, the stretching of the depletion layer is effectively suppressed, since the portion of p-type region 14A having the greatest impurity concentration is in contact with the regions 17. Therefore, even if the channel is shortened as a result of reduction in the size, the threshold voltage Vth can be restrained from decreasing because of the p-type region 14A formed under the channel, and the so-called short-channel effect can be decreased. The p-type region 14A, is brought into contact with the source and drain regions 17 over lines or small areas on both sides thereof. Therefore, the junction capacity between them is small, and the elements can be operated at high speeds. Accordingly, the elements can be formed in small sizes, integrated highly densely, and can be operated at high speeds.

Figure 2:
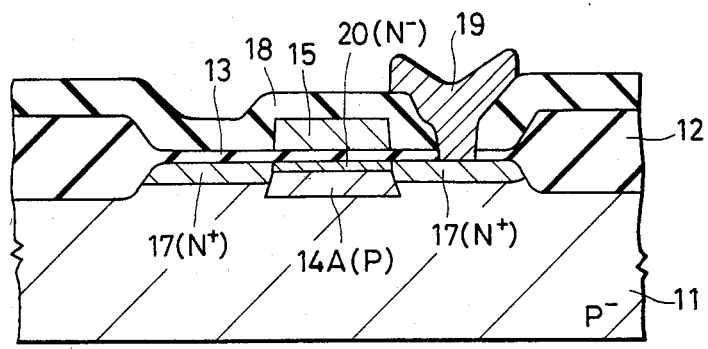
FIG. 2 is a sectional view showing a modified example of the embodiment of FIG. 1.

In the step of FIG. 1(A), arsenic ions may be implanted shallowly after the p-type region 14 has been formed. In this case, as shown in FIG. 2, an n-type layer 20 of a low impurity concentration is formed on the main surface of the substrate under the gate electrode 15. Namely, arsenic ions are implanted into a portion shallower than the p-type region 14. The region 20 works to preclude the effects of impurities in the p-type region 14 from acting upon the surface (channel) of the substrate 11. Therefore, the impurity concentration in the region 14(14A) can be increased to more effectively extinguish the short-channel effect. Furthermore, the threshold voltage of the MOS-type field-effect transistor can be easily controlled.

In the embodiment of FIG. 2, furthermore, the surface of the substrate 11 may not be of the n-type by the implantation of arsenic ions, but may be of the p-type of a low concentration by implanting impurities. Even in this case, the effect of p-type region 14 is prevented from acting upon the surface of the substrate 11.

FIGS. 3(A) to 3(E) illustrate manufacturing steps according to a second embodiment of the present invention, wherein the same portions as those of FIG. 1 are denoted by the same reference numerals.

Figure 3A:
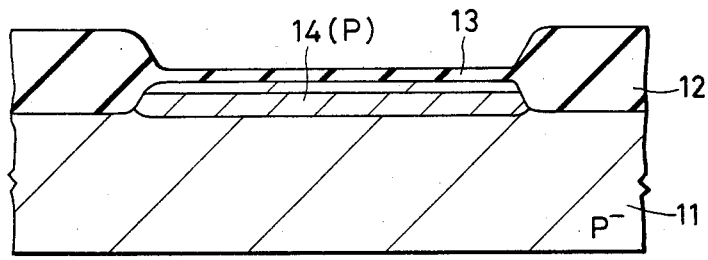
FIGS. 3(A) to 3(E) are sectional views showing steps in a manufacturing process according to another embodiment, and showing the finished state.

First, as shown in FIG. 3(A), a field insulating film 12, a gate insulating film 13 and a p-type semiconductor region 14 are formed by the step of FIG. 1(A) explained in conjunction with the first embodiment.

Figure 3B:
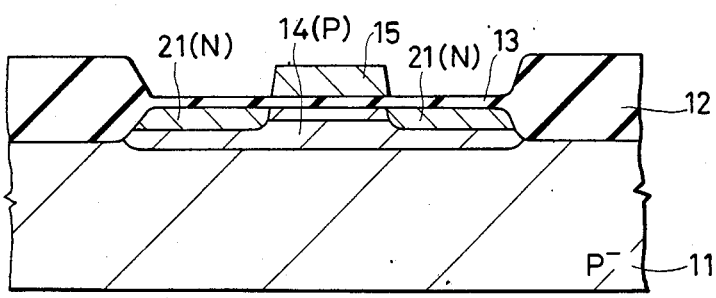

Then, as shown in FIG. 3(B), a gate electrode 15 is formed on the substrate 11 by the step shown in FIG. 1(B). Using the gate electrode 15 as a mask, phosphorus ions are shallowly implanted into the substrate 11 and are annealed. The ions are implanted with the energy of several tens of KeV. An n-type semiconductor region 21 is thus formed. The impurity concentration in the surface of the semiconductor region 21 may be, for instance, $1 \times 10^{18}$ atoms/cm³. The junction depth of the region 21 may be, for instance, 0.2 μm. However, the junction depth is in no way limited to this value only. The region 21 has such high concentration that the region 14 superposed thereon is cancelled.

Figure 3C:
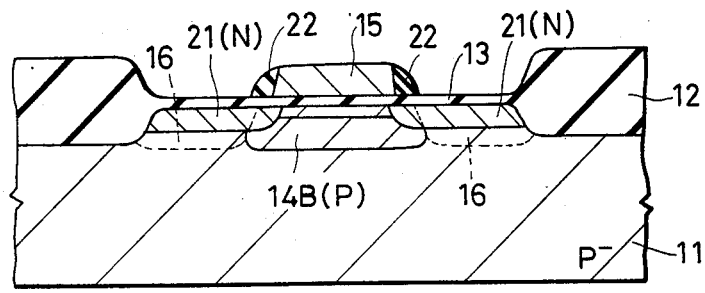

Spacers (side wall insulating films) 22 are formed on each side of the gate electrode 15 as shown in FIG. 3(C). The spacers 22 are formed after forming the region 21 by, for example, depositing a silicon oxide film on the whole surface of the substrate by CVD, and removing the silicon oxide film by a reactive ion etching method. Then, using the spacers 22 and the gate electrode 15 as masks, phosphorus ions are deeply implanted into the substrate 11 and are annealed. This is performed under the same conditions as those of the step of FIG. 1(B). The p-type region 14 is cancelled by ion-implanted portions 16. The p-type region 14 is left only under the gate electrode 15 and spacers 22 as denoted by 14B. In the n-type region 21, the concentration of impurities is increased slightly in the part that is not positioned under the spacers 22.

Figure 3D:
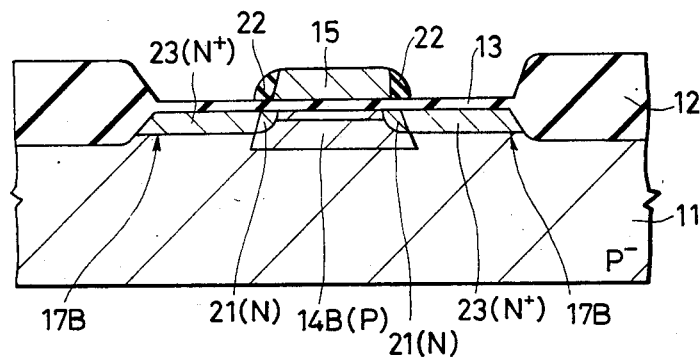

Using the spacers 22 and gate electrode 15 as masks, arsenic ions are implanted and annealed. The ions are implanted with the energy of several tens of KeV. Thus, there are formed, as shown in FIG. 3(D), n-type semiconductor regions of a high impurity concentration, i.e., regions 23 that are separated from the gate electrode 15. The impurity concentration in the surface of the n+-type semiconductor regions 23 may be, for example, $1 \times 10^{20}$ atoms/cm$^3$. The junction depth of the regions 23 will be, for example, 0.2 μm. The junction depth, however, is in no way limited to this value only. Source and drain regions 17B of a so-called LDD (lightly doped drain) construction are constituted by the low impurity concentration portions 21 positioned under the spacers 22 on each side of the gate electrode 15, and the high impurity concentration portions 23.

Figure 3E:
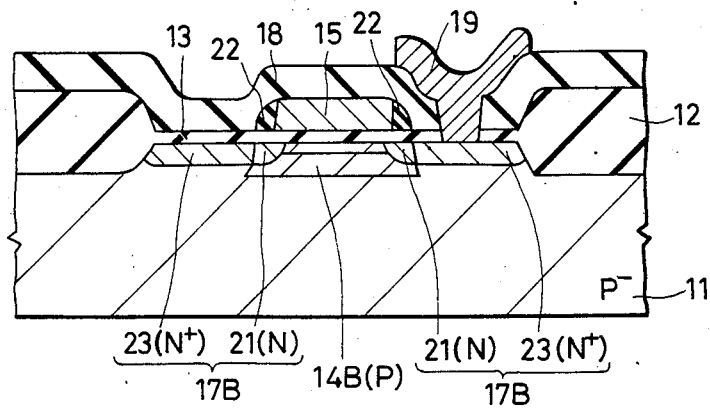

Then, the interlayer film 18 and wiring 19 are formed in the same manner as in the first embodiment, thereby to complete the MOS-type field-effect transistor shown in FIG. 3(E).

According to this construction, the region 14B is brought at portions on one side into contact with the source region and on the other side with the drain region 17B. Therefore, the junction capacity between them can be reduced. Furthermore, since the source and drain regions 17B have the LDD construction, the drain breakdown voltage can be increased. The short-channel effect can be decreased, too.

Figure 4:
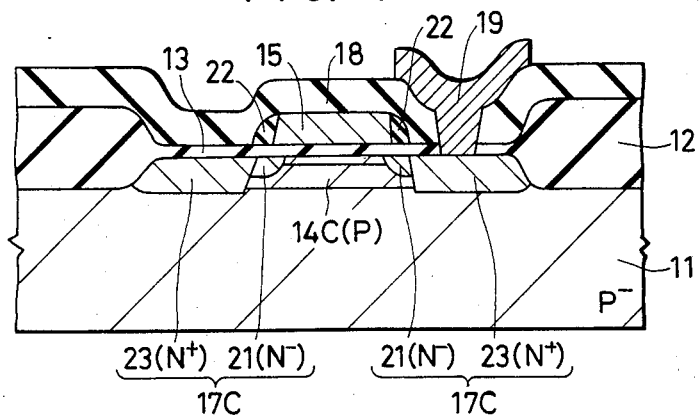
FIG. 4 is a sectional view showing a modified example of the embodiment of FIG. 3.

FIG. 4 shows a third embodiment of the present invention, which is modified from the second embodiment.

In this embodiment, high impurity concentration portions 23 formed by implanting arsenic ions are formed deeper than the p-type region 14 and the n−-type regions 21.

To form the device of the third embodiment, the n+-type regions 23 are formed by implanting ions at a concentration and with a energy higher than those of the second embodiment. Prior to effecting this step, phosphorus ions are implanted in the step of FIG. 3(C) of the second embodiment using the gate electrode and a photoresist (1 μm thick) formed thereon as a mask, at a high concentration and sufficiently deep.

Accordingly, the p-type region 14C is formed between the n+-type regions 23, i.e., in the channel region only, making it possible to decrease the short-channel effect. In this embodiment, furthermore, the high impurity concentration portion 23 can be deeply formed to lower the resistance of the source and drain regions 17C.

Here, phosphorus ions may not be implanted (corresponds to the step of FIG. 3(C)) to cancel the p-type region 14, but instead, arsenic ions may be implanted at a high concentration to form the high impurity concentration portions 23. This makes it possible to cancel the p-type region 14 while forming high impurity concentration portions 23 that serve as source and drain regions, and thereby to form the semiconductor region 14C of the third embodiment.

Figure 5A:
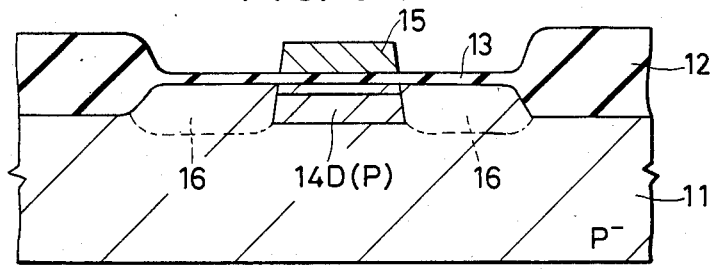
FIGS. 5(A) to 5(C) are sectional views showing steps in a manufacturing process according to a further embodiment, and showing the finished state.
Figure 5B:
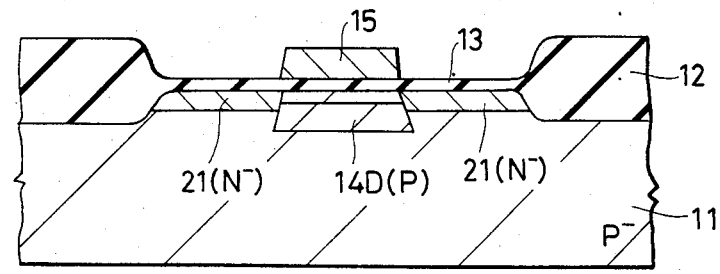
Figure 5C:
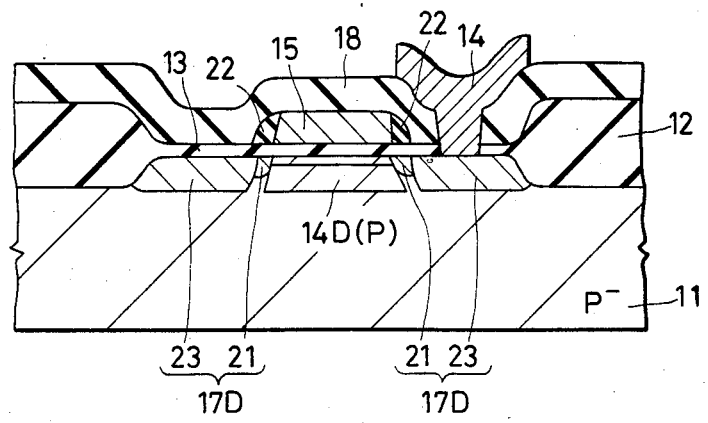

FIGS. 5(A) to 5(C) illustrate a fourth embodiment of the present invention, which is modified from the second embodiment.

The p-type region 14 is formed by the step of FIG. 3(A) and, then, the gate electrode 15 is formed as shown in FIG. 5(A) (same as the step of FIG. 1(A)). Then, phosphorus ions are implanted by using the gate electrode 15 as a mask to cancel the p-type region 14, and a p-type region 14D is formed (same as the step of FIG. 1(B)). Thereafter, as shown in FIG. 5B, phosphorus ions are shallowly implanted again by using the gate electrode 15 as a mask, and are annealed to form low impurity concentration portions 21. Spacers 22 are then formed on each side of the gate electrode 15 in the same manner as in the step of FIG. 3(C). Next, as shown in FIG. 5(C), arsenic ions are implanted by using the gate electrode 15 and spacers 22 as masks, and are annealed. High impurity concentration portions 23 are thus formed. The source and drain regions 17D are comprised of high impurity concentration portions 23 and low impurity concentration portions 21, and constitute a so-called LDD construction.

According to this embodiment, the p-type region 14D is formed only under the gate electrode 15. That is, the p-type region 14D is brought into contact with only the low impurity concentration portions 21 of the source and drain regions 17D. Consequently, the short-channel effect can be decreased as in the aforementioned embodiments, and the junction capacity can be greatly reduced with respect to the source and drain regions, making it possible to operate the device at a further increased speed. The impurity concentrations in the surface of the regions 21 and 23 may be the same as those of the embodiment of FIG. 3.

FIGS. 6(A) to 6(D) illustrate manufacturing steps according to a fifth embodiment of the present invention.

Figure 6A:
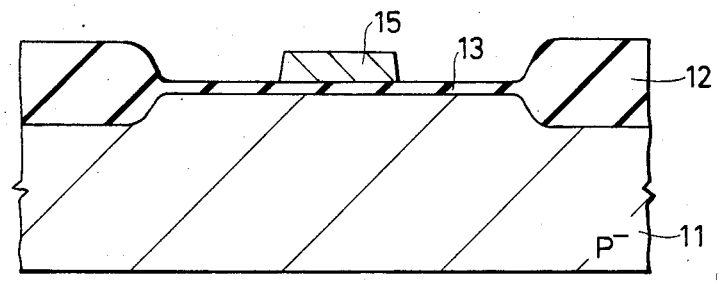
FIGS. 6(A) to 6(D) are sectional views showing steps in a manufacturing process according to a still further embodiment, and showing the finished state.

First, as shown in FIG. 6(A), the field insulating film 12, gate insulating film 13 and gate electrode 15 are formed on the semiconductor substrate 11.

Figure 6B:
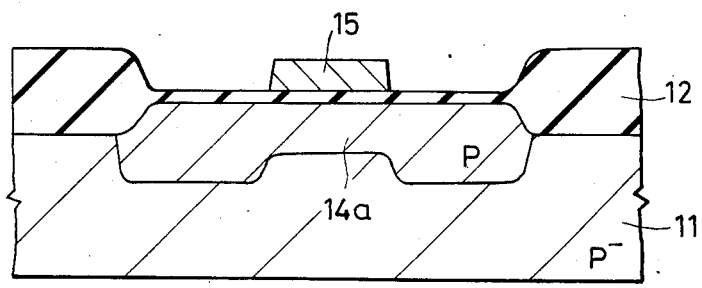

Then, as shown in FIG. 6(B), boron ions are implanted with a relatively large energy to form the p-type semiconductor region 14a deeply in the substrate. Here, being prevented by the gate electrode 15, ions are implanted in reduced amounts into the substrate 11 under the gate electrode 15; i.e., ions are implanted under the gate electrode 15 less deeply than other portions.

Figure 6C:
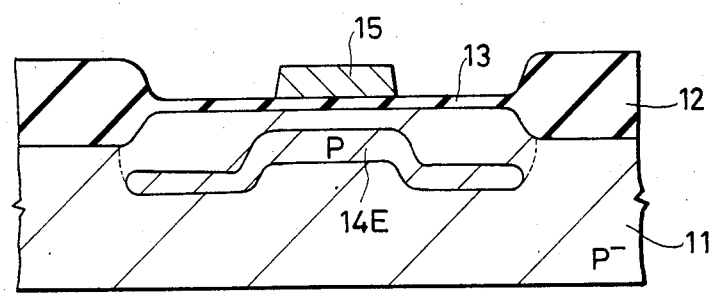

Phosphorus ions are then implanted relatively shallowly to cancel a portion on the upper side of the p-type region 14a as shown in FIG. 6(C). Thus, a p-type region 14E is formed like a belt nearly at the central position of the substrate 11 in the direction of the thickness thereof. Since the ions are implanted shallowly under the gate electrode 15, the region 14E is formed like a step as shown in FIG. 6(C). Here, the impurity concentration in the cancelled portion may be equal to, or greater than, that of the substrate.

Figure 6D:
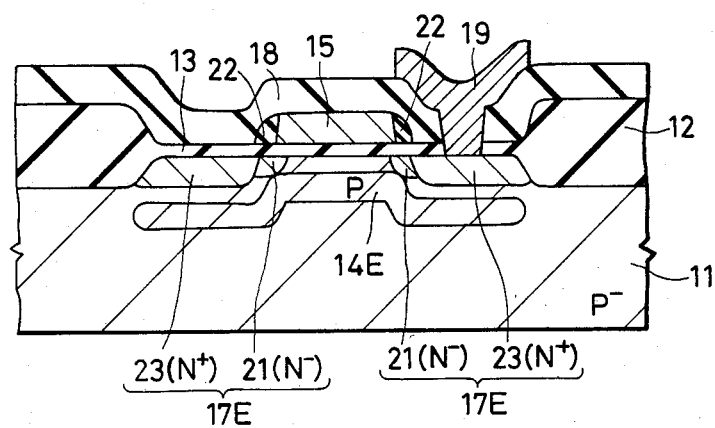

Then, as shown in FIG. 6(D), low impurity concentration portions 21 are formed by using the gate electrode 15 as a mask and by implanting phosphorus ions. After spacers 22 are formed on each side of the gate electrode 15, arsenic ions are implanted by using the gate electrode 15 and spacers 22 as masks, thereby to form high impurity concentration portions 23. Thus, source and drain regions 17E of the LDD construction are formed. The p-type region 14E comes at each side thereof into contact with the low impurity concentration portions 21 of the source and drain regions 17E.

According to this embodiment, the p-type region 14E can exist not only in the channel region but also over the whole region of the MOS-type field-effect transistor. This is effective to prevent the punch-through between the source and the drain in the substrate 11 deep under the gate electrode 15. Therefore, the short-channel effect can be reduced more effectively. Since the p-type region 14E contacts the source and drain regions 17E over very small areas, the junction capacity can be decreased, as a matter of course. According to this embodiment, furthermore, the p-type region 14E exists over the whole region of the MOS-type field-effect transistor, and is effective to prevent the occurrence of soft errors caused by x-rays and the like.

Even in this embodiment, the source and drain regions may have the single impurity concentration.

The present invention offers the effects mentioned below. (1) A semiconductor region is formed at least under the channel of an MOS-type field-effect transistor, the semiconductor region having the same type of conductivity as the substrate and an impurity concentration higher than that of the substrate. The semiconductor region is contacted at each side thereof to the source and drain regions, and helps decrease the short-channel effect such as decrease of threshold voltage caused by the reduction in the size of MOS-type field-effect transistor. Therefore, the elements can be formed in smaller sizes, and a semiconductor device of a high degree of integration can be realized.

(2) The semiconductor region contacts the source and drain regions only on the sides thereof. Therefore, the contact areas between the semiconductor region and the source and drain regions are reduced, the junction capacity is reduced between them, and the elements or the semiconductor device can be operated at high speeds.

(3) The source and drain regions can be formed in the LDD construction to increase the breakdown voltage. Further, the effects of the semiconductor region being compounded, it is possible to obtain a semiconductor device having MOS-type field-effect transistors that are highly integrated, that operate at high speeds and that exhibit a high withstand voltage.

(4) The impurity layer is formed in advance deeply in the substrate, and ions are implanted using the gate electrode as a mask to form the semiconductor region and the source and drain regions. This permits the semiconductor region to be formed in the channel region only, the short-channel effect to be reduced, contact areas to be reduced relative to the source and drain regions, and the MOS-type field-effect transistor to have a small junction capacity.

(5) Spacers are formed on each side of the gate electrode, and then there are formed the semiconductor region, and the source and drain regions of the LDD construction. Therefore, the MOS-type field-effect transistors of the aforementioned construction can be formed all being self-aligned.

(6) After the gate electrode is formed, impurities are deeply implanted to form the semiconductor region, and then impurities are shallowly implanted to cancel part of the semiconductor region. Thus, the semiconductor region is formed. Namely, the semiconductor region is formed over the whole region of the MOS-type field-effect transistor, and is located shallowly in the channel region. Therefore, there is obtained a semiconductor region having MOS-type field-effect transistors that exhibit reduced short-channel effect, that are highly integrated, and that operate at high speeds.

In the foregoing were concretely described the invention accomplished by the inventors by way of embodiments. Note, however that the invention is in no way limited to the above-mentioned embodiments only but can be modified in a variety of other ways without departing from the spirit and scope of the invention.

Figure 7:
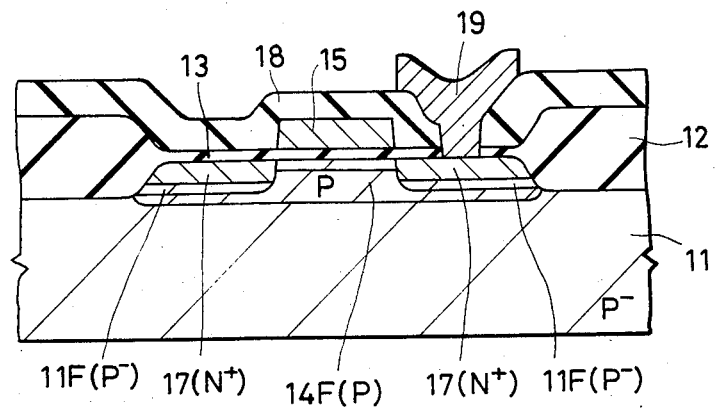
FIG. 7 is a sectional view showing a yet further embodiment.
Figure 8:
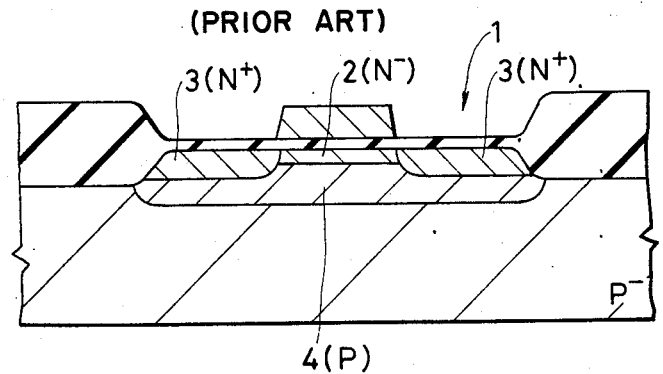
FIG. 8 is a sectional view showing a conventional construction.

For instance, the p-type region 14F can be formed as shown in FIG. 7. Namely, the device shown in FIG. 7 is a modification from the embodiment of FIG. 1. In the step of FIG. 1(B), the phosphorus ions are implanted with a low energy. Therefore, portions on the upper side of the p-type region 14 are cancelled except the portion under the gate electrode 15. The region 14F having a higher impurity concentration than the substrate 11 is left in a convex shape. Here, the regions 11F have an impurity concentration which is the same as, or higher than, that of the substrate 11, and is lower than that of the p-type region 14F. In this embodiment, the p-type region 14F does not contact the source and drain regions 17 over wide areas; hence, the junction capacity is small. Like the embodiment of FIG. 6, furthermore, the device of this embodiment is resistant against soft errors caused by x-rays and the like. This embodiment can be adapted not only to the embodiment of FIG. 1 but also to the embodiments shown in FIGS. 2, 3 and 5.

Implantation of arsenic ions into regions shallower than the p-type region 14 of the second embodiment can be adapted to all other embodiments mentioned in the foregoing.

Depth and concentration of the source and drain regions should be set to optimum values depending upon the characteristics of the element. The gate electrode may be made of a high melting point metal such as molybdenum, tungsten, tantalum, titanium or the like, or a silicide of such a high melting point metal, or a double-layer film composed of a polycrystalline silicon layer on which is formed a high melting point metal layer or a silicide layer thereof. Thickness of the gate electrode can be varied by forming a mask on the gate electrode at the time of implanting ions as shown in FIG. 1(B).

The semiconductor regions may have conductivities of opposite types. Further, the MOS-type field-effect transistor may be formed in a well region in the semiconductor substrate.

The invention can further be adapted to a p-channel MOS-type field-effect transistor, an MOS-type field-effect transistor having a floating gate, and to p-channel and n-channel MOS-type field-effect transistors constituting a CMOS circuit.

The foregoing description has chiefly dealt with the cases where the invention accomplished by the inventors was adapted to an n-channel MOS-type field-effect transistor in the field of art that served as a background of the invention. The invention, however, should in no way be limited thereto only, but can also be adapted to an MIS-type field-effect transistor in which the gate insulating film is composed of a material other than the oxide film. The invention can be adapted to general semiconductor devices equipped with field-effect transistors.

We claim:

1. A semiconductor device having an MIS-type field-effect transistor which is formed in a first semiconductor region of a first type of conductivity in a semiconductor substrate, and which comprises:
   a gate electrode formed on a gate insulating film on a surface of said semiconductor substrate;
   a source region and a drain region of a second type of conductivity formed in said first semiconductor region, one on each side of said gate electrode, each of the source and drain regions having a bottom surface, said bottom surface being the surface farthest from the semiconductor substrate surface having the gate insulating film thereon; and
   a second semiconductor region which is formed in said first semiconductor region only under said gate electrode, said second semiconductor region being separated from the surface of said semiconductor substrate having the gate insulating film thereon and from the bottom surface of said source and drain regions, and being contacted at one end to said source region and at the other end to said drain region, said second semiconductor region further having the same type of conductivity as said first semiconductor region and an impurity concentration higher than that of said first semiconductor region, wherein a part of said second semiconductor region extends deeper than said bottom surface of said source and said drain regions.

2. A semiconductor device according to claim 1, wherein said source and drain regions are each comprised of a first portion formed by using said gate electrode as a mask, and a second portion formed by using said gate electrode and side wall insulating films formed on each side of said gate electrode as masks, said second portions having an impurity concentration higher than that of said first portions.

3. A semiconductor device according to claim 2, wherein said second semiconductor region is in contact with said first and second portions of said source and drain regions.

4. A semiconductor device according to claim 2, wherein said second semiconductor region is in contact with only said first portions of said source and drain regions.

5. A semiconductor device having an MIS-type field-effect transistor which is formed in a first semiconductor region of a first type of conductivity in a semiconductor substrate having a gate insulating film and a field insulating film thereon, and which comprises:
   a gate electrode formed on the gate insulating film on a surface of said semiconductor substrate;
   a source region and a drain region of a second type of conductivity formed in said first semiconductor region, one on each side of said gate electrode, each of the source and drain regions having a bottom surface, said bottom surface being the surface farthest from the semiconductor substrate surface having the gate insulating film thereon; and
   a second semiconductor region of first type of conductivity which is formed in said first semiconductor region under said gate electrode, said second semiconductor region being a region formed by a first implantation implanting impurities of first type conductivity using said field insulating film as a mask, and by a second implantation implanting impurities of second type conductivity using said field insulating film and said gate electrode as a mask such that the impurities of second type conductivity compensate said impurities of first type conductivity, with a part of said second semiconductor region extending deeper than the bottom surface of said source and said drain regions.

6. A semiconductor device according to claim 5, wherein a part of said second semiconductor region extends below the bottom surface of said source region and said drain region and is separated from said source region and said drain region by a region having an impurity concentration which is at least as great as that of said substrate but is lower than that of said second semiconductor region.

7. A semiconductor device according to claim 5, wherein said second semiconductor region is separated from the surface of said semiconductor substrate having the gate insulating film thereon and from said bottom surface of said source and drain regions, and is contacted at one end to said source region and at the other end to said drain region.

8. A semiconductor device according to claim 7, wherein the impurity concentration of said second semiconductor region is higher than that of said first semiconductor region.

9. A semiconductor device according to claim 8, wherein a third semiconductor region having said second type of conductivity is located between said second semiconductor region and the surface of said first semiconductor region.

10. A semiconductor device having an MIS-type field-effect transistor which is formed in a first semiconductor region of a first type of conductivity in a semiconductor substrate having a gate insulating film and a field insulating film thereon, and which comprises:
    a gate electrode formed on said gate insulating film on said semiconductor substrate;
    side wall insulating films formed on each side of said gate electrode;
    a source region and a drain region of a second type of conductivity formed in said first semiconductor region one on each side of said gate electrode, said source region and said drain region comprising first portions formed by implanting second conductivity type impurities using said gate electrode as a mask and second portions formed by implanting second conductivity type impurities using said gate electrode and said side wall insulating films as a mask respectively, each of the source and drain regions having a bottom surface, said bottom surface being the surface farthest from the semiconductor substrate surface having the gate insulating film thereon; and
    a second semiconductor region of first type of conductivity which is formed in said first semiconductor region under said gate electrode, said second semiconductor region being a region formed by a first implantation implanting impurities of first type conductivity using said field insulating film as a mask and by a second implantation implanting impurities of second type conductivity using said field insulating film, said gate electrode and said side wall insulating films as a mask to compensate said first conductivity type impurities, wherein a part of said second semiconductor region extends deeper than the bottom surface of said source and said drain regions.

11. A semiconductor device according to claim 10, wherein said second semiconductor region is separated from the surface of said semiconductor substrate and from said bottom surface of said source and drain regions, and is contacted at one end to said first and second portions of said source region and at the other end to said first and second portions of said drain region.

12. A semiconductor device according to claim 11, wherein the impurity concentration of said second semiconductor region is higher than that of said first semiconductor region.

13. A semiconductor device according to claim 12, wherein a third semiconductor region having said second type of conductivity is located between said second semiconductor region and the surface of said first semiconductor region.

14. A semiconductor device according to claim 12, wherein the impurity concentration of said first portions of said source and drain regions are lower than that of said second portions of said source and drain regions.

15. A semiconductor device according to claim 14, wherein the junction depth of said first portions of said source and drain regions are less than that of said second portions of said source and drain regions.

16. A semiconductor device according to claim 11, wherein said second semiconductor region is in contact with only said first portions of said source and drain regions.

17. A semiconductor device having an MIS-type field-effect transistor which is formed in a first semiconductor region of a first type of conductivity in a semiconductor substrate, and which comprises:

a gate electrode formed on a gate insulating film on a surface of said semiconductor substrate;

a source region and a drain region of a second type of conductivity formed in said first semiconductor region, one on each side of said gate electrode, each of said source and drain regions having a bottom surface, said bottom surface being the surface farthest from the semiconductor substrate surface having the gate insulating film thereon; and a second semiconductor region which is formed in said first semiconductor region under said gate electrode, said second semiconductor region being separated from the surface of said semiconductor substrate having the gate insulating film thereon and from the bottom surface of said source and drain regions, and being contacted at one end to said source region and at the other end to said drain region, said second semiconductor region further having the same type of conductivity as said first semiconductor region and an impurity concentration higher than that of said first semiconductor region, wherein a part of said second semiconductor region extends deeper than the bottom surface of said source and said drain regions.

18. A semiconductor device according to claim 17, wherein said second semiconductor region is a region formed by a first implantation implanting impurities of first type conductivity using said field insulating film and said gate electrode as a mask, and by a second implantation implanting impurities of second type conductivity using said field insulating film and said gate electrode as a mask such that the impurities of second conductivity compensate an upper portion of said impurities of first type conductivity, wherein a portion of said second semiconductor region extends below the bottom surface of said source region and said drain region and is separated from the bottom region of said source region and said drain region by a compensated portion of said second semiconductor region, said compensated portion being a portion formed by said second implantation.

* * * * *